United States Patent
Liu

(12) 
(10) Patent No.: US 6,225,660 B1
(45) Date of Patent: May 1, 2001

(54) SINGLE POLY EPLD CELL AND ITS FABRICATING METHOD

(75) Inventor: Chia-Chen Liu, Hsinchu (TW)

(73) Assignee: Worldwide Semiconductor Manfacturing Corp. (TW)

(*) Notice: Subject to any disclaimer, the term of this patent is extended or adjusted under 35 U.S.C. 154(b) by 0 days.

(21) Appl. No.: 09/418,833

(22) Filed: Oct. 15, 1999

(30) Foreign Application Priority Data

Aug. 19, 1999 (TW) .................................................. 88114216

(51) Int. Cl.$^7$ ..................................................... H01L 29/72
(52) U.S. Cl. ........................... 257/318; 257/316; 257/321; 257/326
(58) Field of Search .................................. 257/316, 318, 257/321, 326

(56) References Cited

U.S. PATENT DOCUMENTS 6,017,792 * 1/2000 Sharma et al. ........................ 257/318

* cited by examiner

Primary Examiner—Edward Wojciechowicz

(57) ABSTRACT

The present invention discloses an EPLD cell includes a semiconductor substrate, tunnel buried layer, control gate, and floating gate. The tunnel buried layer and control gate, which has a three-dimensional contour, are formed under the surface of semiconductor substrate by implanting N-type dopant. The floating gate formed completely over the tunnel buried layer and partially over the control gate, is insulating from them by oxide layers. Because of the three-dimensional contour of control gate, the overlapped area between the floating gate and control gate could be increase without expanding horizontal area of the cell. Therefore, the efficiency of the cell can be improved without degrading the integration in applying the cell.

25 Claims, 5 Drawing Sheets

US 6,225,660 B1

SINGLE POLY EPLD CELL AND ITS FABRICATING METHOD

FIELD OF THE INVENTION

The present invention relates to a single poly EPLD (Erasable Programmable Logic Device) cell, and especially to a method to approach the single poly EPLD cell.

BACKGROUND OF THE INVENTION

An erasable programmable logic device (EPLD), such as EPROM, EEPROM, a widely used semiconductor device, is capable to preserve digital information without supply of electric power and to erase the digital information in some ways. Commonly, the EPLD cell preserves digital information by biasing its control gate to drive electrons penetrating through a tunnel oxide layer into its floating gate. After the release of bias, the electrons would lack enough energy to escape form the energy barrier of oxide layer surrounded the floating gate thereby allowing the EPLD cell to preserve information. As for erasing the information, the electrons trapped in the floating gate could be evacuated form it by exposing the EPLD cell in an environment with a specific dose of ultraviolet or inputting extra voltages to specific electrodes of the EPLD cell. Since the EPLD cell has the feature of repeatedly recording information in a state out of supply of electric power, it is employed in many integrated circuits nowadays.

Referring to FIG. 1, an EPLD cell 100 includes a semiconductor substrate 102, in which a first device region 103 and second device region 101 are defined by isolation regions 104. A tunnel buried layer 108 with N-type dopant is formed under the surface of first device region 103. Similarly, a control gate 106 is formed under the surface of second device region 101 by implanting N-type dopant. Upon the control gate 106, a second oxide layer 116 is formed thereon. In addition, a first oxide layer 112 is formed upon the tunnel buried layer 108. The central region of first oxide layer 112 has a thickness thinner than that of the peripheral region of first oxide layer so as to serve as a tunnel oxide layer 114 for allowing the electrons of the tunnel buried layer 108 to pass through it. A polysilicon layer 110 is stacked completely over the first oxide layer 112 and tunnel oxide layer 114, and partially on the second oxide layer 116, wherein the uncovered region of second oxide layer 116 is remained for receiving input voltages.

When the EPLD cell records information, the control gate 106 would be biased in a potential by inputting a voltage through its uncovered region. Since the control gate 106, second oxide layer 116, and floating gate 110 are stacked as a capacitance structure, the potential of the control gate 106 would be coupled to the floating gate 110 to drive electrons of the tunnel buried layer 108 ejecting through the tunnel oxide layer 114 into the floating gate 110, and then trapped therein. The trapped electrons would affect the threshold voltage of the EPLD cell 100, thereby achieving the purpose of preserving information. Contrarily, for erasing the information preserved in the EPLD cell 100, electrically connecting the control gate 106 to ground and the tunnel buried layer 108 to positive voltage, the electrons trapped in the floating gate 110 would be driven out so as to clear the preserved information.

An indicator to evaluate the efficiency of EPLD cell is determined by the speed of driving electrons into the floating gate 110. However, the speed depends on the coupling potential of floating gate, which is responsive to the potential of control gate 106, and the potential of control gate 106 is related to the overlapped area between the floating gate 110 and control gate 106. Therefore, the larger overlapped area between the floating gate 110 and control gate 106, the better efficiency of the EPLD cell 100. Unfortunately, increasing the overlapped area would expand the horizontal area of the cell, thereby degrading the integration of integrated circuit employing this cell.

In light of the foregoing, the present invention proposes a novel design of EPLD cell and is fabricating method in order to resolve the dilemma between the integration and cell efficiency.

SUMMARY OF THE INVENTION

An object of the invention is to disclose a structure of EPLD cell with improved efficiency, and without degrading its integration.

Another object of the invention is to provide a method to approach the EPLD cell.

A semiconductor substrate with a first device region and second device region, which are defined by isolation regions, is provided. Etching the second device region, a three-dimensional contour is shaped thereon. A tunnel buried layer and control gate are formed by implanting N-type ions under the surface of semiconductor substrate. Thermally treating the semiconductor substrate, oxide layers are then formed upon the tunnel buried layer and control gate. A floating gate made of polysilicon is formed completely over the tunnel buried layer, and partially over the control gate. Inputting a voltage through the uncovered region of the control gate, due to the sandwich structure—control gate, oxide layer, and floating gate, the inputting voltage would be couple to the floating gate to drive electrons of the tunnel buried layer ejecting into the floating gate, thereby achieving the function of preserving information.

BRIEF DESCRIPTION OF THE PREFERRED EMBODIMENT

DETAILED DESCRIPTION OF THE PREFERRED EMBODIMENT

The present invention discloses an EPLD cell with reduced area and improved efficiency. An embodiment of the EPLD cell is firstly illustrated as follows in association with its function schemes. Thereafter, a method to approach the present EPLD cell is showed for introducing its fabricating processes.

Figure 1:
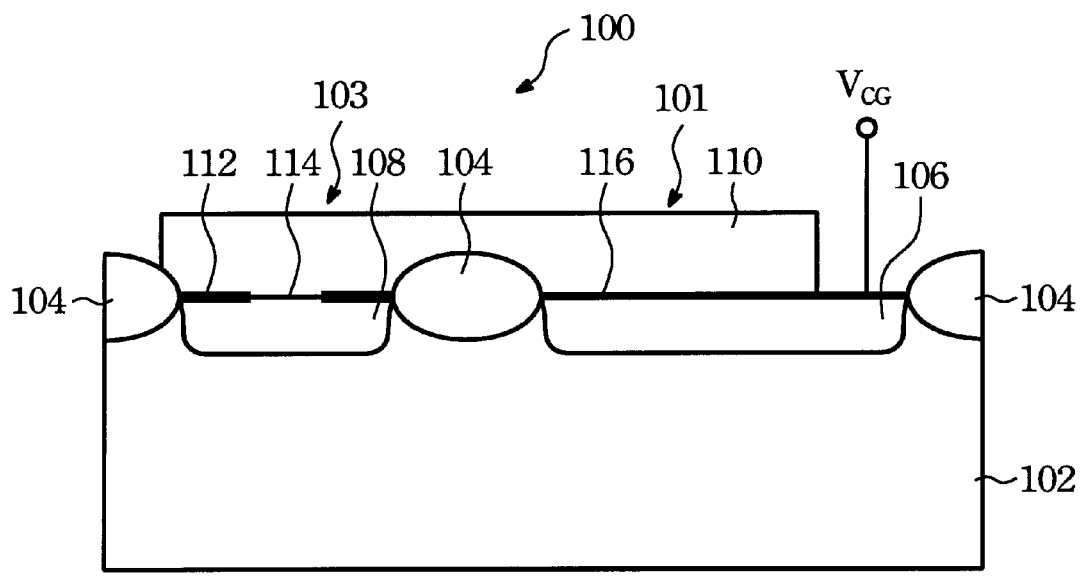
FIG. 1 is a cross-sectional side view of a traditional EPLD cell.
Figure 2:
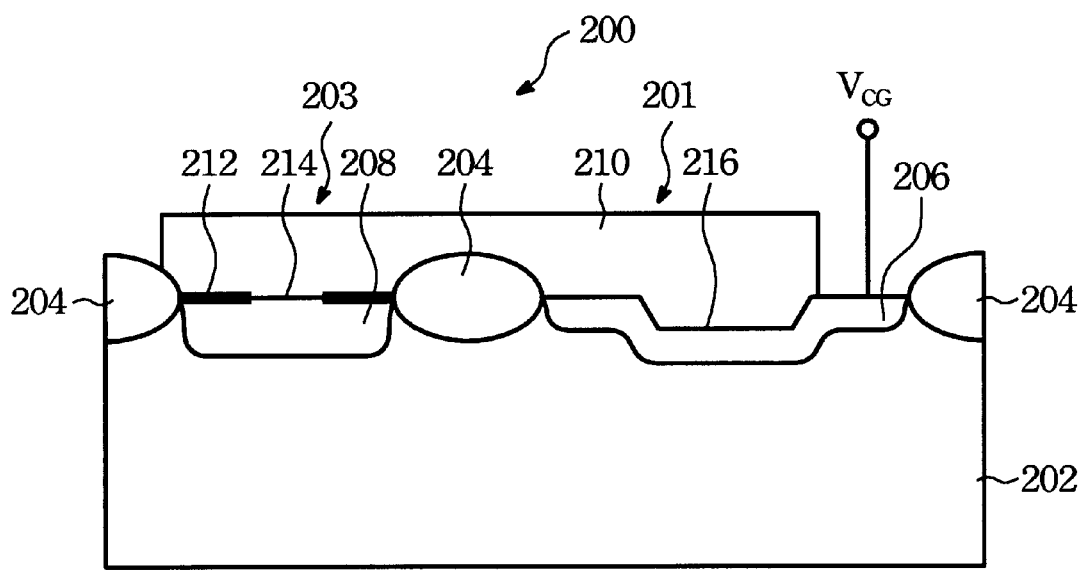
FIG. 2 is a cross-sectional side view of an EPLD cell according to the resent invention.

FIG. 2 is a cross-sectional side view of an EPLD cell 200, which is constructed in and on a semiconductor substrate 202, divided by isolation regions 204 into a first device region 203 and second device region 201. A tunnel buried layer 208 with N-type dopant is formed under the surface of first device region 203. Similarly, a control gate 206 is formed under the surface of second device region 201 by implanting N-type dopant. It's noticed that, different form the traditional structure, the surface of control gate 206 is shaped into a three-dimensional contour so as to increase its surface area without expanding the horizontal area of the EPLD cell.

Upon the control gate 206, a second oxide layer 216 is formed thereon. In addition, a first oxide layer 212 is formed upon the tunnel buried layer 208. The central region of first oxide layer 212 has a thickness thinner than that of the peripheral region of first oxide layer so as to serve as a tunnel oxide layer 214 for allowing the electrons of the tunnel buried layer 108 to pass through it. Moreover, a polysilicon layer 210 is stacked completely over the first oxide layer 212 and tunnel oxide layer 214, and partially on the second oxide layer 216, wherein the uncovered region of second oxide layer 216 is remained for receiving input voltages.

When the control gate 206 is biased through its uncovered region to a voltage level, the floating gate 210 would generate a coupling potential responsive to voltage level. If the coupling potential is high enough, the electrons existing in the tunnel buried layer 208 will eject through the tunnel oxide layer 214 into floating gate 210, thereby adjusting the threshold voltage of the EPLD cell 200 for achieving the purpose of preserving information. Since the efficiency of EPLD cell 200 depends on the coupling potential of floating gate 210, and the coupling potential is determined by the overlapped area between the floating gate 210 and control gate 206, the three-dimensional contour of control gate 206, which increase the total overlapped area, would improve the efficiency of EPLD cell 200. Furthermore, the overlapped area is increased by shaping the contour of control gate 206 three-dimensionally, therefore preventing the cell 200 form widening. In this preferred embodiment, the surface of control gate 206 is a trench-like shape, which sinks into the semiconductor substrate 202. However, other alternatives with three-dimensional contour, such as wavy shape, granular shape, should be regarded as equivalent substitutions according to the invention.

Figure 3:
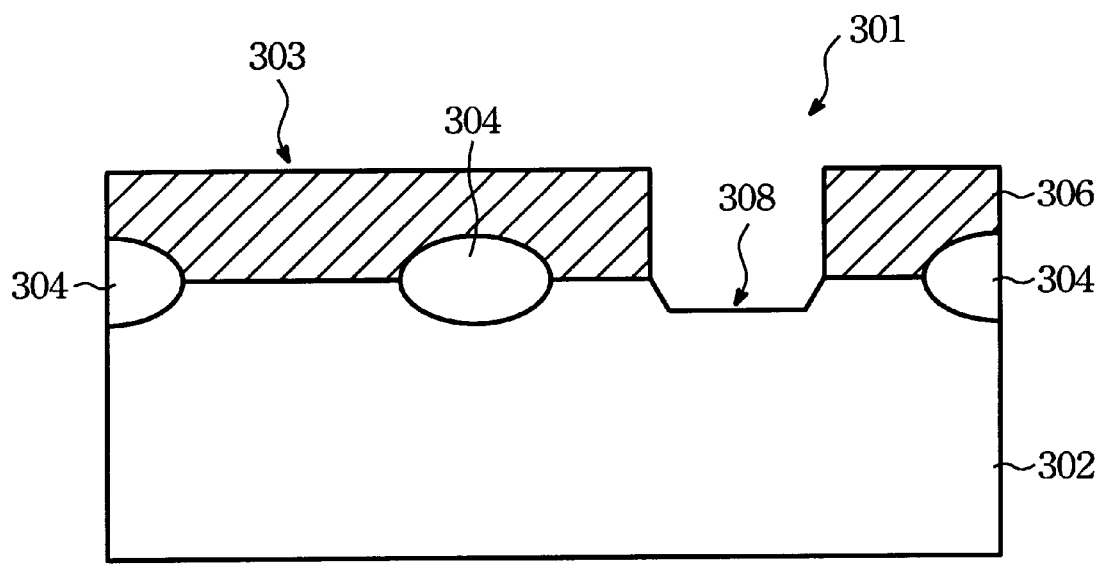
FIG. 3 is a cross-sectional side view of a semiconductor substrate with isolation regions for illustrating the method to approach the EPLD cell according to the present invention.

FIG. 3 shows initial processes of fabricating the present EPLD cell. A semiconductor substrate 302 is provided with isolation regions 304 atop, dividing a first device region 303 and second device region 301. A photoresist layer 306 is formed on the semiconductor substrate 302 to define a trench for establishing a three-dimensional contour. The semiconductor substrate is etched to form the trench 308 on the semiconductor substrate 302, and then the photoresist layer 306 is removed. In this preferred embodiment, the isolation regions 304 are so called FOX isolations. However, equivalent alternatives, such as shallow trench isolation, still can be employed as isolations in the present EPLD cell. The trench 308 is merely an option among various three-dimensional contours. As for its side walls, it is suggested to fabricate in an angle fewer than 80 degrees for benefiting the following processes.

Figure 4:
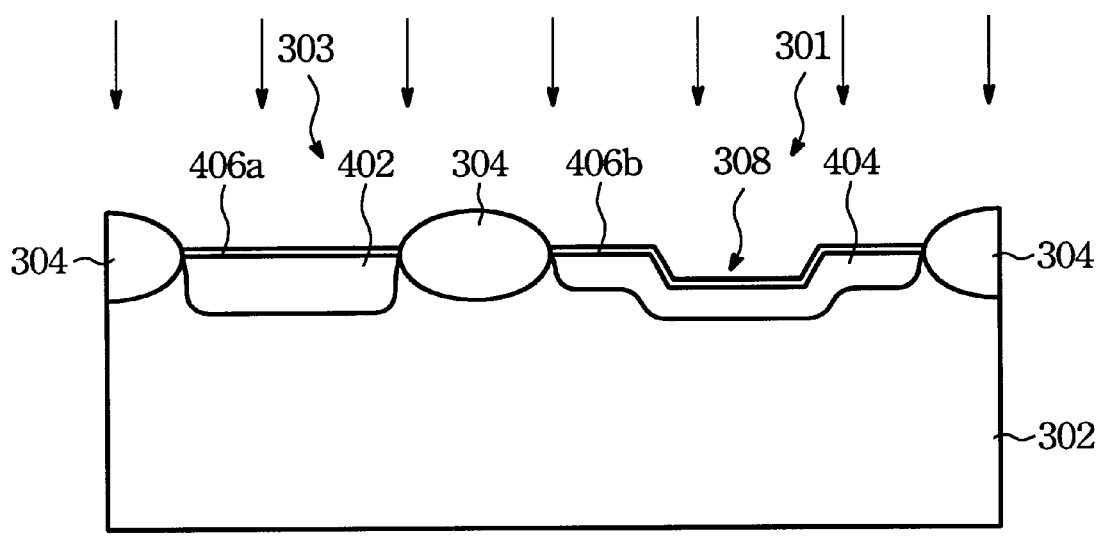
FIG. 4 is a cross-sectional side view of the semiconductor substrate, in which a tunnel buried layer and control gate are formed.

Referring to FIG. 4, a tunnel buried layer 402 and control gate 404 are formed under the surface of semiconductor substrate 302 by implanting N-type dopant. After the formation of the tunnel buried layer 402 and control gate 404, a first oxide layer 406a and second oxide layer 406b are formed on the surfaces of tunnel buried layer 402 and control gate 404. In this preferred embodiment, the implantation is performed in a dosage between about $1\times10^{14}\sim 5\times10^{14}$ cm$^{-2}$, a density between about $1\times10^{19}\sim 1\times10^{20}$ cm$^{-3}$, and the first oxide layer 406a and second oxide layer 406b are formed through a thermal oxidization process to grow in a thickness about 150 angstroms. It's noticed that the oxide layers can also be formed through a CVD process, which is already well known in the art.

Figure 5:
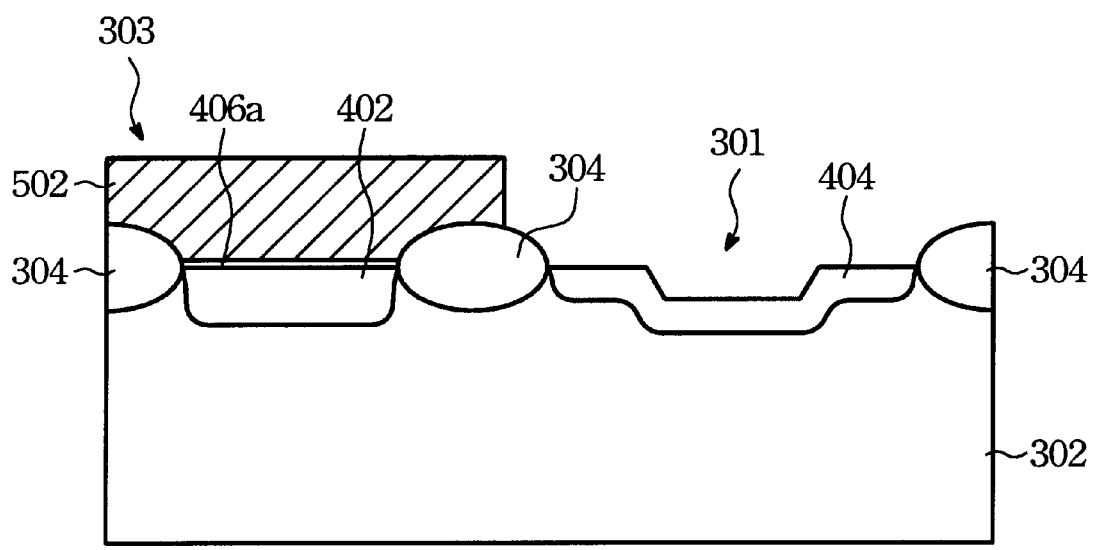
FIG. 5 is a cross-sectional side view of the semiconductor substrate, in which one of oxide layers is stripped.

Turning to FIG. 5, a photoresist layer 502 is formed over the first oxide layer 406a for serving as an etching mask. The second oxide layer 406b (see FIG. 4) is then stripped through an etching process, due to the different requests of thickness of the tunnel buried layer 402 and control gate 404. Successively, the photoresist layer 502 is then stripped.

Figure 6:
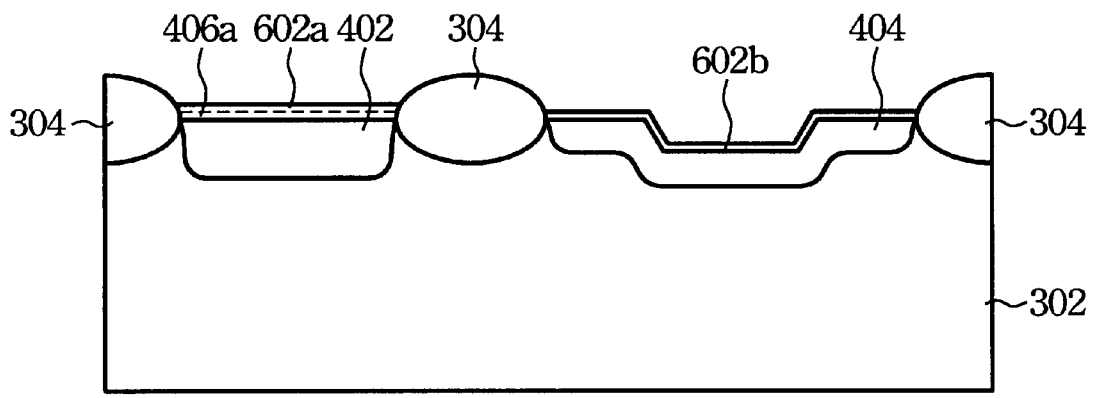
FIG. 6 is a cross-sectional side view of the semiconductor substrate, upon which a first oxide layer and second oxide layer are formed.

Referring to FIG. 6, after the photoresist layer 502 (see FIG. 5) is removed, the semiconductor substrate 302 is thermally treated in an environment with oxygen to grow an oxide film thereon. In this preferred embodiment, the fourth oxide layer 602b formed upon the control gate is in a thickness about 80 angstroms. The third oxide layer 602a formed upon the first oxide layer 406a would be in a thickness fewer than 80 angstroms, because the oxidizing rate of the surface of first oxide layer 406a is lower than that of the surface of control gate 404. In addition, although the third oxide layer 602b and fourth oxide layer 602a could be from through a CVD process, it is suggested to form them through an oxidization process for achieving better material characters.

Figure 7:
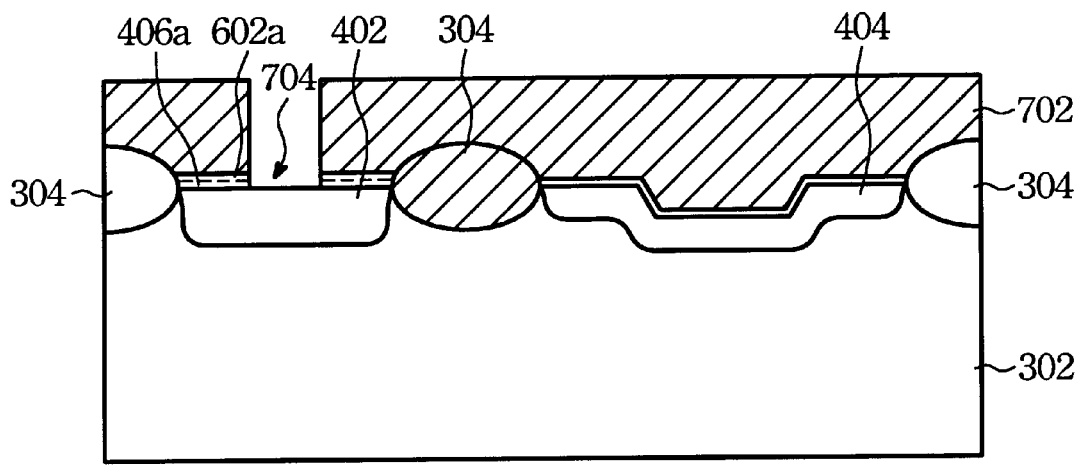
FIG. 7 is a cross-sectional side view of the semiconductor substrate with a photoresist layer formed thereon to define a tunnel oxide region.

Referring to FIG. 7, a photoresist layer 702 is then formed upon the third oxide layer 602a and fourth oxide layer 602b to define a tunnel oxide region for allowing electrons to penetrate. Using the photoresist layer 702 as an etching mask, parts of the third oxide layer 602a and first oxide layer 406a are removed until the partial surface of tunnel buried layer 402, which is defined by the photoresist layer 702, is exposed. Thereafter, the photoresist layer 702 is stripped.

Figure 8:
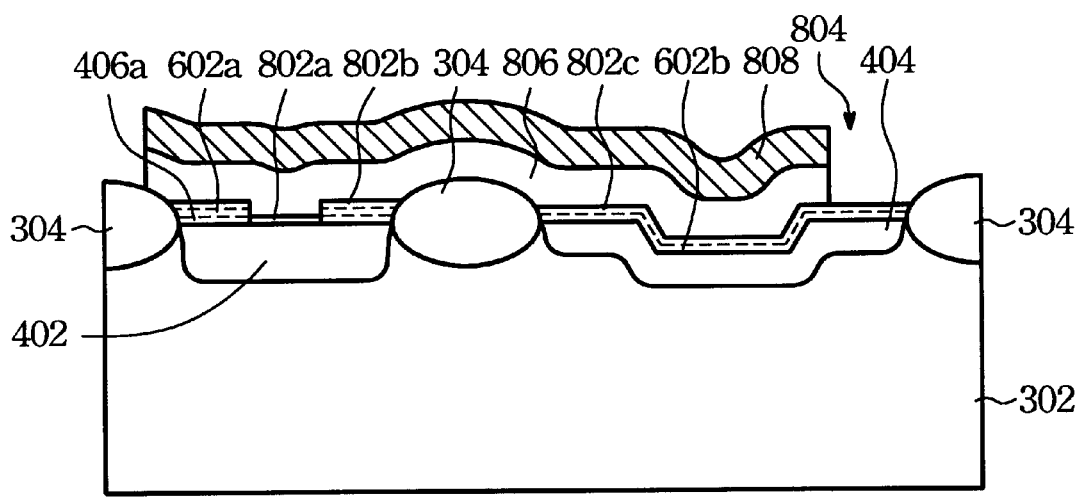
FIG. 8 is a cross-sectional side view of the semiconductor substrate with a polysilicon layer and silicide layer stacked thereon.

Referring to FIG. 8, the semiconductor substrate 302 is thermally treated ion an environment with oxygen to grow a tunnel oxide layer 802a, and thicken the third oxide layer 602a in an added thickness 802b and the fourth oxide layer 602b in an added thickness 802c. Since the tunnel oxide layer 802a is acted as a light energy barrier for allowing electrons repeatedly to pass through, its thickness and characters are crucial issues to fabricate an efficient EPLD cell. In this preferred embodiment, the tunnel oxide layer 704 is formed in a thickness between about 75~85 A through an oxidization process. The thickness of the oxide layer surrounded around the tunnel oxide layer 802a, i.e. 406a, 602a, and 802b, between about 220~240 A, and the thickness of the oxide layer atop control gate 404, i.e. 602b and 802c, is between about 120~140 A. After the formation of the oxide layers, a polysilicon layer 806 and silicide layer 808, such as tungsten silicide, titanium silicide, and cobalt silicide, is stacked completely over the tunnel buried layer 402, and partially over the control gate 404, through a CVD process.

Figure 9:
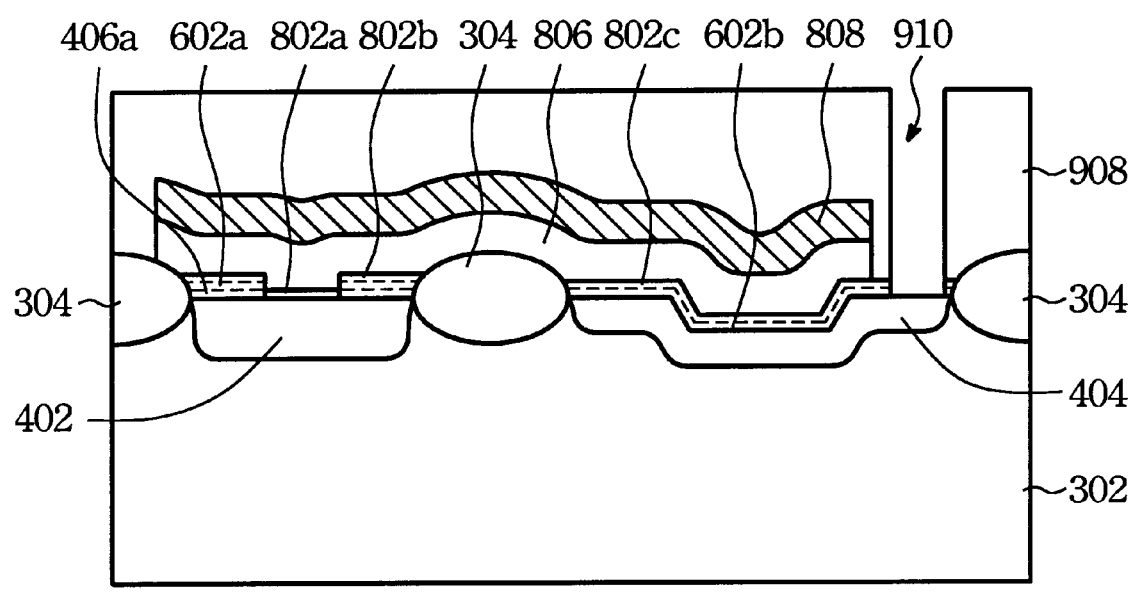
FIG. 9 is a cross-sectional side view of the semiconductor substrate with a dielectric layer formed thereon.

Finally referring to FIG. 9, a dielectric layer 908 is deposited on the silicide layer 808. Patterning the dielectric layer 908, a contact hole 910 is then formed on the uncovered region of control gate for allowing external voltage inputting to the control gate 404. In addition, various optional structures, such as LDD, DDD, Spacer, and so on, can be selectively integrated into the present EPLD cell.

As is understood by a person skilled in the art, the foregoing preferred embodiments of the present invention that are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A singly poly EPLD cell, which comprises:

a semiconductor substrate;

a tunnel buried layer formed in a first region of the semiconductor substrate;

a control gate formed in a second region of the semiconductor substrate and separated from the tunnel buried layer by an isolation region, the control gate having a tree-dimensional contour for increasing surface areas of the control gate; and a floating gate formed above the tunnel buried layer and the control gate, when the control gate is biased to a potential, the floating gate being responsive to the potential and generating a coupling potential thereby driving and confining electrons of the tunnel buried layer into the floating gate.

2. The single poly EPLD cell of claim 1, further comprising a first oxide layer on a surface of the tunnel buried layer for insulating the tunnel buried layer from the floating gate.

3. The single poly EPLD cell of claim 2, wherein a central region of the first oxide layer is thinner than peripheral region of the first oxide layer, the central region being so called tunnel oxide layer for allowing the electrons of the tunnel buried layer to eject into the floating gate.

4. The single poly EPLD cell of claim 3, wherein the peripheral region of the first oxide layer has a thickness between about 210~250 A.

5. The single poly EPLD cell of claim 3, wherein the tunnel oxide layer has a thickness between about 75~85 A.

6. The single poly EPLD cell of claim 1, wherein the tunnel buried layer is doped with N-type dopant.

7. The single poly EPLD cell of claim 6, wherein the N-type dopant is implanted in a dosage between about $1\times10^{14}$~$5\times10^{14}$ cm$^{-2}$.

8. The single poly EPLD cell of claim 1, further comprising a second oxide layer on a surface of the control gate for insulating the control gate from the floating gate.

9. The single poly EPLD cell of claim 8, wherein the second oxide layer has a thickness between about 120~140 A.

10. The single poly EPLD cell of claim 1, wherein the three-dimensional contour comprises a trench profile.

11. The single poly EPLD cell of claim 10, wherein the trench profile has side walls within an angle in a range fewer than 80 degrees.

12. The single poly EPLD cell of claim 1, wherein the control gate is doped with N-type dopant.

13. The single poly EPLD cell of claim 12, wherein the N-type dopant is implanted in a density between about $1\times10^{19}$~$1\times10^{20}$ cm$^{-3}$.

14. The single poly EPLD cell of claim 1, wherein the floating gate comprises a stacked layer of a polysilicon layer and a silicide layer.

15. The single poly EPLD cell of claim 1, wherein the floating gate completely covers the tunnel buried layer and partially covers the control gate, and uncovered regions of the control gate are prepared for forming a contact hole.

16. A method for approaching a single poly EPLD cell comprising following steps:

providing a semiconductor substrate with a first device region and a second device region, the first device region being divided from the second device region by an isolation region;

etching the semiconductor substrate for forming a three-dimensional contour on a surface of the second device region;

implanting ions into the semiconductor substrate thereby forming a first doped region under a surface of the first device region and a second doped region under a surface of the second device region;

forming a first oxide layer on the first doped region and a second oxide layer on the second doped region; and forming a polysilicon layer on the first oxide layer and the second oxide layer, wherein the polysilicon layer completely covers the first doped region and partially covers the second doped region, an uncovered area of the second doped region being preserved for allowing to input external voltage to the second doped region.

17. The method of claim 16, before the step of etching the semiconductor substrate, further comprising a following step:

forming a photoresist layer on the semiconductor substrate for defining the three-dimensional contour of the second device region.

18. The method of claim 16, before the step of forming a polysilicon layer, further comprising following steps:

forming a first photoresist layer on the semiconductor substrate for covering the first device region;

etching the semiconductor substrate for removing the second oxide layer from a surface of the second doped region;

removing the first photoresist layer;

oxidizing the semiconductor substrate for thickening the first oxide layer and growing a third oxide layer on the second doped region;

forming a second photoresist layer on the semiconductor substrate for defining a tunnel oxide region atop the first oxide layer;

etching the semiconductor substrate for partially removing the first oxide layer uncovered by the second photoresist layer;

removing the second photoresist layer; and oxidizing the semiconductor for growing a tunnel oxide layer on the tunnel oxide region and thickening the first oxide layer and the third oxide layer.

19. The method of claim 18, after the step of oxidizing the semiconductor for growing a tunnel oxide layer, wherein the first oxide layer has a thickness between about 210~250 A.

20. The method of claim 18, after the step of oxidizing the semiconductor for growing a tunnel oxide layer, wherein the tunnel oxide layer has a thickness between about 75~85 A.

21. The method of claim 18, after the step of oxidizing the semiconductor for growing a tunnel oxide layer, wherein the third oxide layer has a thickness between about 120~140 A.

22. The method of claim 16, after the step of forming a polysilicon layer, further comprising following steps:

forming a silicide layer on the polysilicon layer;

forming a dielectric layer on the silicide layer and over the semiconductor substrate; and etching the dielectric layer for forming a contact hole on the uncovered area of the second doped region.

23. The method of claim 16, wherein the three-dimensional contour of the second device comprises a trench profile.

24. The method of claim 16, wherein the ions comprise N-type dopant.

25. The method of claim 16, wherein the ions are implanted in a dosage between about $1\times10^{14}$~$5\times10^{14}$ cm$^{-2}$.

* * * * *